United States Patent [19]
Tamada

[11] Patent Number: 5,170,181
[45] Date of Patent: Dec. 8, 1992

[54] LASER SCANNING APPARATUS

[75] Inventor: Sakuya Tamada, Tokyo, Japan

[73] Assignee: Sony Corporation, Tokyo, Japan

[21] Appl. No.: 660,801

[22] Filed: Feb. 25, 1991

[30] Foreign Application Priority Data

Feb. 28, 1990 [JP] Japan .................................. 2-047426

[51] Int. Cl.[5] ............................................. H04M 1/21
[52] U.S. Cl. ..................................... 346/108; 359/196
[58] Field of Search .......................... 346/108, 107 R; 359/196, 204, 205, 223, 224, 225

[56] References Cited

U.S. PATENT DOCUMENTS 4,662,727  5/1987  Griffin ................................. 359/351
4,669,883  6/1982  Ina et al. ............................. 250/400

*Primary Examiner*—Mark J. Reinhart
*Attorney, Agent, or Firm*—Philip M. Shaw, Jr.

[57] ABSTRACT

A laser scanning apparatus having horizontal and vertical deflection means for deflecting n laser beams of the same wavelength modulated by n kinds of pattern information signal components in the horizontal and vertical directions. The n laser beams are spatially separated so that the pattern informations are directly drawn on a plurality of drawn media. Thus, pattern informations of different patterns can be drawn on the plurality of drawn media by one horizontal deflection means and one vertical deflection means, whereby the laser scanning apparatus can be made compact in size, light in weight and small in power consumption. Also, the pattern informations can be drawn with high coupling ratio (high light utilizing ratio and proper brightness) and high resolution.

16 Claims, 7 Drawing Sheets

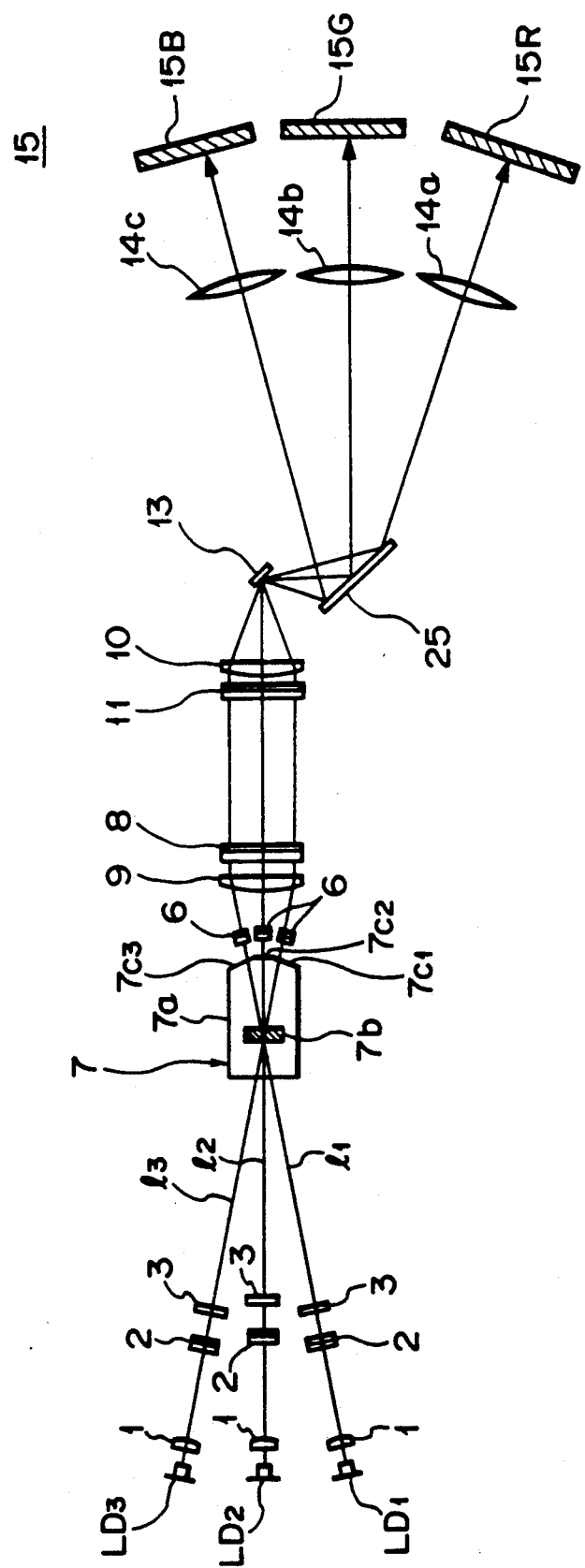

LASER SCANNING APPARATUS

BACKGROUND OF THE INVENTION

1. Field of the Invention

The present invention generally relates to laser scanning apparatus and, more particularly, is directed to a laser scanning apparatus for drawing pattern informations, e.g., image, mask pattern, etc. on a drawing medium such as film, photoresist used to make a printed circuit board and a semiconductor integrated circuit, light valve used in a big-screen display device and so on by laser beams.

2. Description of the Prior Art

Conventionally, when a picture is drawn on a drawing medium such as a light valve used in a big-screen display device and so on, as shown in FIG. 1, an image input system 33 is utilized, in which an optical fiber plate 32 is secured to a display screen of a cathode ray tube 31. The optical fiber plate 32 is formed of a bundle of a number of fiber optics, and the optical fiber plate 32 and a light valve 34 are bonded together by an optical bonding agent 35. When a color video projector such as a color television receiver or the like is formed by using the image input system 33, three cathode ray tubes for producing three colors of red, green and blue, for example, a red cathode ray tube 31R, a green cathode ray tube 31G and a blue cathode ray tube 31B are employed and a red light valve 34R, a green light valve 34G and a blue light valve 34B are respectively provided on the entire surfaces of the cathode ray tubes 31R, 31G and 31B, thus forming three image input systems 33R, 33G and 33B, respectively.

Then, a light from a white light source 41 forming a read light source is divided to provide red, green and blue lights to operate the light valves 34R, 34G and 34B of red, green and blue colors. More specifically, the light from the white light source 41 passes a ultra-violet filter 42 and an infrared filter 43 and then its first polarized component is reflected by a polarizing beam splitter film 44, whereby only a red light becomes incident on the red light valve 34R by a red transmissible dichroic mirror 45. A second polarized component is passed through the polarizing beam splitter film 44 and then becomes incident on a green reflecting dichroic mirror 46, whereby only a green light is made incident on the green light valve 34G. Of the second polarized components passed through the green reflecting dichroic mirror 46, only a blue light becomes incident on the blue light valve 34B by means of a blue transmissible dichroic mirror 47. Then, red, green and blue lights are projected on a screen 49 through a projecting lens 48 to thereby obtain a color image.

That is, images corresponding to incident images from the cathode ray tubes are formed by an electrooptic effect of liquid crystal layers within the light valves and resultant images are projected on the screen 49 as a color image in an enlarged scale (see The Journal of the Institute of Television Engineers of Japan, Vol. 38, No. 4(1984)).

Another example of a conventional image input system 52 will be described below. As shown in FIG. 3, in this image input system 52, a light valve 34 is disposed distant from the cathode ray tube 31 and a focusing lens system 51 is disposed between the cathode ray tube 31 and the light valve 34. While the focusing lens system 51 is represented by a single lens in FIG. 3, this focusing lens system 51 is formed, in actual practice, by several sets of combination lenses, each set being formed of several lenses. When the projector such as the color television receiver or the like is constructed by using this image input system 52, it is composed of three image input systems similarly to FIG. 2.

However, in order to obtain high resolution in the image input system 33 shown in FIG. 1, the number of fiber optics forming the optical fiber plate 32 must be increased considerably and a flatness of the optical fiber plate 32 itself must be increased, which unavoidably provides an expensive image input system. Further, considering the F number of the optical fiber plate 32, the F number must be reduced in order to increase sensitivity while the F number must be increased in order to increase resolution of image, which unavoidably provides a relation of antinomy. Therefore, it is very difficult to place the image input system in an optimum condition.

On the other hand, in the image input system 52 shown in FIG. 3, an expensive lens system is indispensable for obtaining image having no distortion and for increasing brightness. Further, since the focusing lens system 51 formed by the combination of several sets of lenses is disposed between the display screen of the cathode ray tube 31 and the light valve 34, a spacing between the cathode ray tube 31 and the light valve 34 is increased, which unavoidably makes the image input system large in size.

The image input systems 33 and 52 shown in FIGS. 1 and 3 have a common defect such that, in the process for projecting the image displayed on the cathode ray tube 31 onto the screen 49 in an enlarged scale, a loss of light is remarkably large, thus making it impossible to obtain bright image. Incidentally, a light utilizing ratio of the image input system 33 of FIG. 1 and the image input system 52 of FIG. 3 is both approximately 10% of the whole light, wherein both the image input systems 33 and 52 generate dark images. For this reason, it is necessary to increase brightness by using the cathode ray tube 31 of high brightness, which unavoidably consumes much power. Further, since the three light valves 34R, 34G and 34B are employed for a color display of the projector, the three cathode ray tubes 31 and so on must be provided in accordance with the three light valves 34, which increases a heavy and large-sized projector accordingly. Therefore, a small projector is not yet realized.

OBJECTS AND SUMMARY OF THE INVENTION

Accordingly, it is an object of the present invention to provide an improved laser scanning apparatus which can substantially eliminate the aforenoted shortcomings and disadvantages encountered with the prior art.

More specifically, it is an object of the present invention to provide a laser scanning apparatus which can be reduced in size.

It is another object of the present invention to provide a laser scanning apparatus which can be reduced in weight.

It is still another object of the present invention to provide a laser scanning apparatus which can reduce a power consumption.

It is a further object of the present invention to provide a laser scanning apparatus in which a pattern information can be drawn with a high coupling ratio (high light utilizing ratio and proper brightness).

It is yet a further object of the present invention to provide a laser scanning apparatus in which a pattern information can be drawn with high resolution.

As a first aspect of the present invention, a laser scanning apparatus is comprised of a laser beam generating device for generating n parallel laser beams of the same wavelength modulated by pattern information signals of n kinds, a first optical system for reducing an alignment pitch of the n laser beams generated from the laser beam generating device and deforming a cross-sectional shape of each of the n laser beams, a single acoustooptic deflector for deflecting the n laser beams emitted from the first optical system in the horizontal direction, a second optical system for enlarging the alignment pitch of the n laser beams emitted from the acoustooptic deflector and deforming a cross-sectional shape of each of the n laser beams, a reflecting device for reflecting the n laser beams emitted from the second optical system such that the n laser beams become incident on vertical deflection device at an angle larger than a vibration angle of the vertical deflection device, and a single vertical deflection device for deflecting the n laser beams in the vertical direction, wherein images are drawn on n different recording media by the n laser beams emitted from the vertical deflection device, respectively.

In accordance with a second aspect of the present invention, a laser scanning apparatus is comprised of a laser beam generating device for generating n parallel laser beams of the same wavelength modulated by pattern information signals of n kinds, a single acoustooptic deflector for deflecting the n laser beams emitted from the laser beam generating device in the horizontal direction, an optical system for introducing the n laser beams emitted from the acoustooptic deflector into vertical deflection device at an angle larger than a vibration angle of the vertical deflection device and deforming a cross-sectional shape of each of the n laser beams, and a vertical deflection device for deflecting the n laser beams in the vertical direction, wherein images are drawn on n different recording media by the n laser beams emitted from the vertical deflection device, respectively.

The above, and other objects, features and advantages of the present invention will become apparent in the following detailed description of illustrative embodiments thereof to be taken in conjunction with the accompanying drawings, in which like reference numerals are used to identify the same or similar parts in the several views.

BRIEF DESCRIPTION OF THE DRAWINGS

FIG. 8 is a schematic diagram showing a second embodiment of the laser scanning apparatus according to the present invention.

DETAILED DESCRIPTION OF THE PREFERRED EMBODIMENTS

Figure 1:
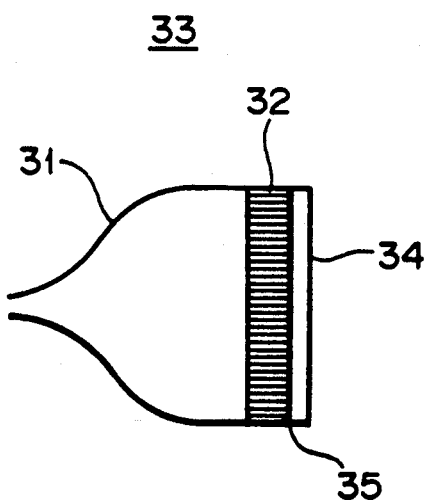
FIG. 1 is a schematic diagram showing an example of an arrangement of an image input system according to the prior art.
Figure 2:
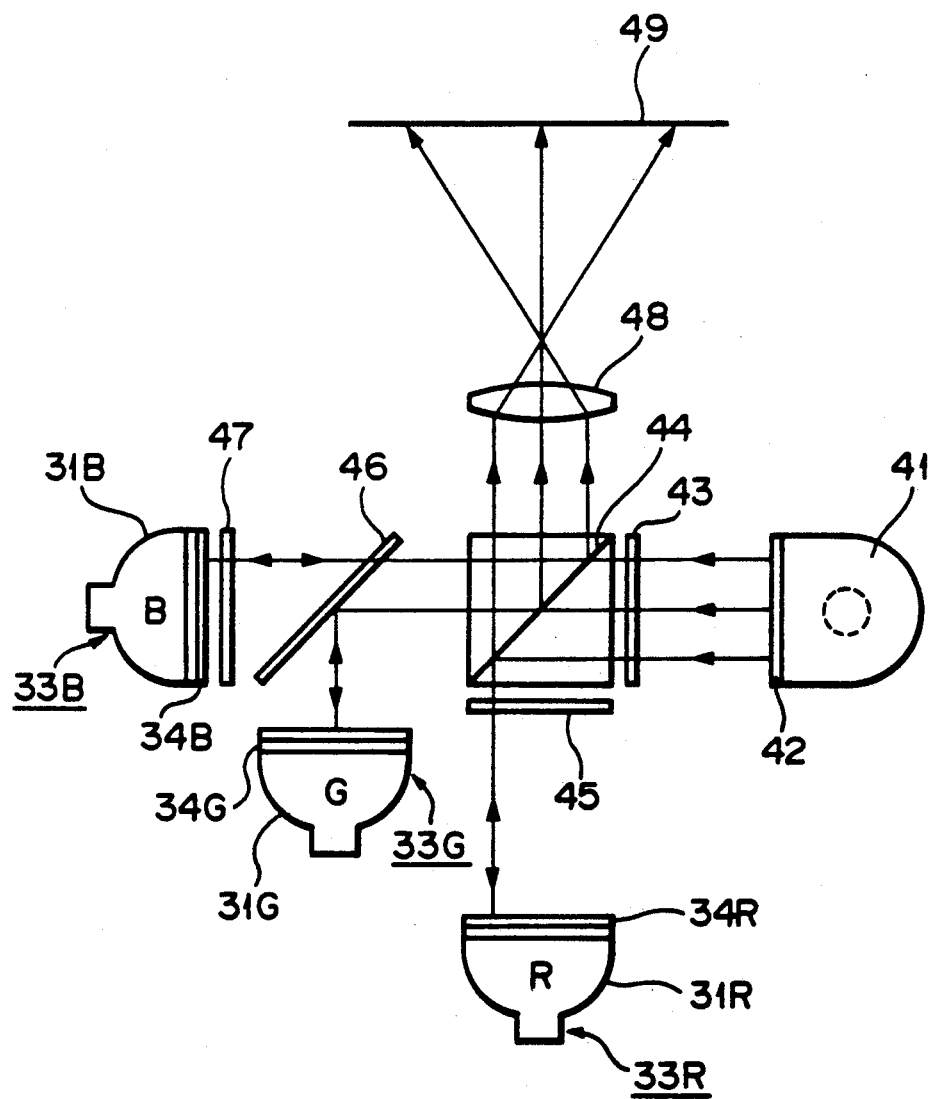
FIG. 2 is a schematic diagram showing an example of an arrangement of a projector according to the prior art.
Figure 3:
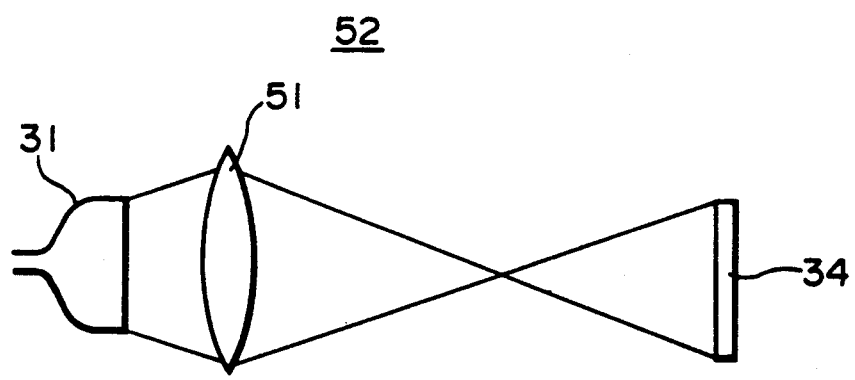
FIG. 3 is a schematic diagram showing another example of the image input system according to the prior art.
Figure 4:
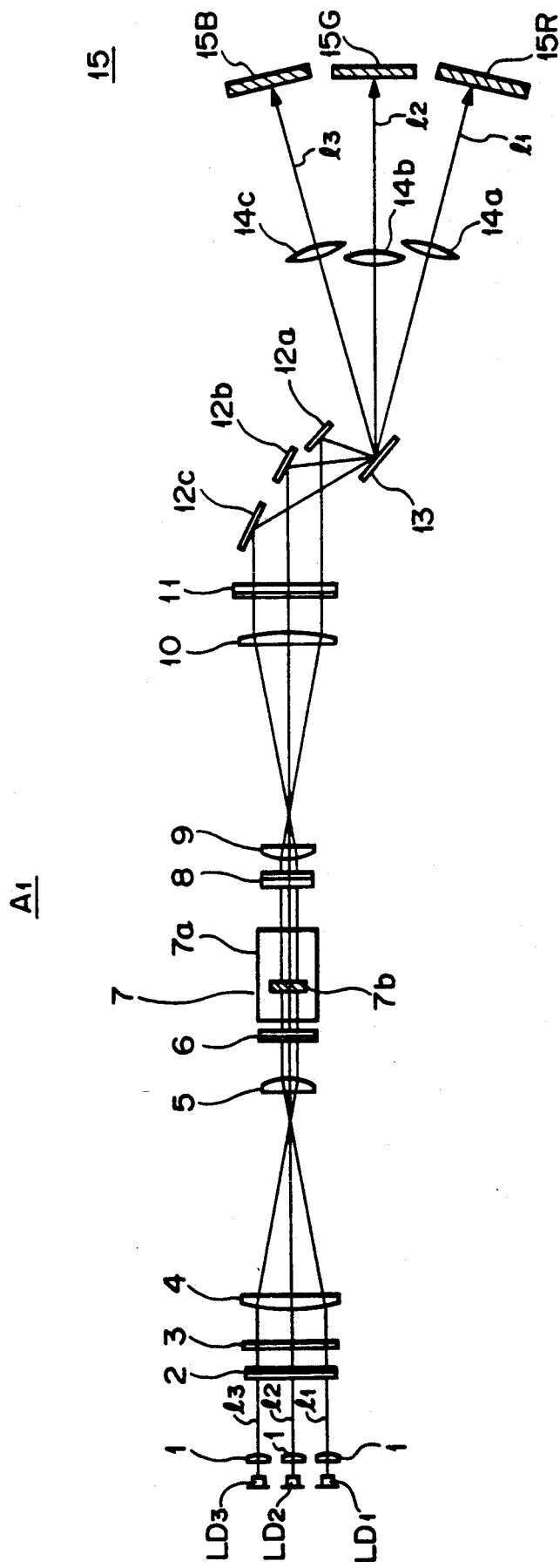
FIG. 4 is a schematic diagram showing a first embodiment of a laser scanning apparatus according to the present invention.

Referring to the drawings in detail, and initially to FIG. 4, a first embodiment of the laser scanning apparatus according to the present invention will be described in detail. FIG. 4 is a schematic diagram showing an arrangement of the laser scanning apparatus which is generally represented by reference numeral $A_1$.

Referring to FIG. 4, three laser beams $l_1$, $l_2$ and $l_3$ are modulated, respectively, red, green and blue video signal components and have the same wavelength. These three laser beams $l_1$, $l_2$ and $l_3$ are respectively emitted from three laser diodes $LD_1$, $LD_2$ and $LD_3$ which are polarized in the vertical direction and as elliptic beams the long axis of each of which is extended in the horizontal direction where the direction in which the laser diodes $LD_1$, $LD_2$ and $LD_3$ are arrayed is taken as the vertical direction. The wavelength of each of the laser beams $l_1$, $l_2$ and $l_3$ is set so as to match with sensitivity of a photoconductive layer of a light valve 15. Also, the respective laser beams $l_1$, $l_2$ and $l_3$ are modulated by directly driving the respective laser diodes $LD_1$, $LD_2$ and $LD_3$ by a current.

The three laser beams $l_1$, $l_2$ and $l_3$ emitted from the laser diodes $LD_1$, $LD_2$ and $LD_3$ are introduced to cylindrical lenses 1, in which they are suppressed in diffusion in the vertical direction and converted into light beams which are collimated in the vertical direction. The parallel laser beams $l_1$, $l_2$ and $l_3$ from the cylindrical lenses 1 are supplied to a cylindrical lens 2, in which they are suppressed in diffusion in the horizontal direction and converted into parallel laser beams in this direction. Then, these laser beams $l_1$, $l_2$ and $l_3$ are supplied to a ½ wavelength plate 3, in which the polarized plane of each of the laser beams $l_1$, $l_2$ and $l_3$ is rotated by 90 degrees and converted in the horizontal direction. At that time, the cross-section of each of the laser beams $l_1$, $l_2$ and $l_3$ becomes a flat shape which is enlarged in the horizontal scanning direction. Thereafter, these laser beams $l_1$, $l_2$ and $l_3$ are sequentially supplied to cylindrical lenses 4 and 5, in which these laser beams $l_1$, $l_2$ and $l_3$ are reduced in spot diameter in the vertical direction, further flattened in cross section and further reduced in alignment pitch. Flatness and alignment pitch of each of these laser beams $l_1$, $l_2$ and $l_3$ are determined by an aperture width of an acoustooptic deflector 7 at its laser beam incident side, as will be referred to later. More specifically, the flatness and alignment pitch of each of the laser beams $l_1$, $l_2$ and $l_3$ are determined such that the three laser beams $l_1$, $l_2$ and $l_3$ may all be introduced into an opening (not shown) of the acoustooptic deflector 7. Then, the respective laser beams $l_1$, $l_2$ and $l_3$ are supplied through a cylindrical lens 6 to the acoustooptic deflector 7. Incidentally, the cylindrical lens 5 may be replaced with a concave lens. Also, the lens system formed of the cylindrical lenses 1 to 5 is an anamorphic afocal system and may be replaced with a prism.

The above-mentioned acoustooptic deflector 7 is composed of an acoustooptic medium 7a and a ultrasonic wave generator 7b utilizing the piezoelectric effect attached to one surface of the acoustooptic medium 7a. When the ultrasonic wave generator 7b is applied with a voltage from a high frequency generator (not shown), a progressive wave of ultrasonic vibration is generated in the acoustooptic medium 7a. At that time, if the oscillation frequency of the high frequency generator is low, the progressive wave has a long wavelength, while if it is high, the progressive wave has a short wavelength.

Then, the laser beams $l_1$, $l_2$ and $l_3$ supplied to the acoustooptic deflector 7 are delivered to the acoustooptic medium 7a, in which they are encountered with the progressive wave of ultrasonic vibration, thereby being diffracted and deflected by the progressive wave. At that time, the shorter the wavelength of the progressive wave of ultrasonic vibration becomes, the more the laser beams $l_1$, $l_2$ and $l_3$ are deflected. Thus, when the oscillation frequency of the high frequency generator is repeatedly swept from a low frequency to a high frequency in a sawtooth waveform fashion, the laser beams $l_1$, $l_2$ and $l_3$ emitted from the acoustooptic deflector 7 are deflected to become horizontal scanning laser beams which repeat the deflection scanning.

Incidentally, the laser beams $l_1$, $l_2$ and $l_3$ are encountered with the progressive waves of different ultrasonic wave frequencies if they become incident on the acoustooptic medium 7a at its portion near to or distant from the ultrasonic wave generator 7b so that the deflection angles are different depending upon the position of the spot diameter. More specifically, if the laser beams $l_1$, $l_2$ and $l_3$ become incident on the acoustooptic medium 7a at its portion near the ultrasonic wave generator 7b, they are encountered with the ultrasonic wave of high frequency and thereby deflected by a large deflection amount, whereas if the laser beams $l_1$, $l_2$ and $l_3$ become incident on the acoustooptic medium 7a at its portion distant from the ultrasonic generator 7b, they are encountered with the ultrasonic wave of low frequency and thereby deflected by a small deflection amount. Therefore, the laser beams $l_1$, $l_2$ and $l_3$ are not collimated but converged and deflected as though they traveled through a cylindrical lens. This phenomenon is what might be called a cylindrical lens effect.

Therefore, according to this embodiment, the cylindrical lens 6 is disposed just ahead of (or just behind) the acoustooptic deflector 7, and the three laser beams $l_1$, $l_2$ and $l_3$ are supplied through the cylindrical lens 6 to the acoustooptic deflector 7, thereby cancelling (correcting) the cylindrical lens effect of the acoustooptic deflector 7 out. Accordingly, the three laser beams $l_1$, $l_2$ and $l_3$ are introduced into the acoustooptic deflector 7 in parallel and emitted from this acoustooptic deflector 7 as horizontal scanning laser beams $l_1$, $l_2$ and $l_3$. Thereafter, the three laser beams $l_1$, $l_2$ and $l_3$ are increased in angular magnification and reduced in spot diameter in the horizontal direction by cylindrical lenses 8 and 11, while they are also increased in alignment pitch and increased in spot diameter in the vertical direction by cylindrical lenses 9 and 10, thus each of the laser beams $l_1$, $l_2$ and $l_3$ being shaped substantially as circle in cross section. That is, the lens system composed of the cylindrical lenses 8 to 11 forms an anamorphic afocal system. Then, the laser beams $l_1$, $l_2$ and $l_3$ are traveled through mirrors 12a, 12b and 12c to a galvano mirror 13, in which these laser beams $l_1$, $l_2$ and $l_3$ are deflected in the vertical scanning direction, i.e., in the vertical direction by a vibration of the galvano mirror 13. At that time, if the laser beams $l_1$, $l_2$ and $l_3$ are adjusted by the mirrors 12a, 12b and 12c so that they may become incident on the galvano mirror 13 with angles larger than a vertical vibration angle of the galvano mirror 13, then the three laser beams $l_1$, $l_2$ and $l_1$, i.e., three images can be separated spatially. Then, the three laser beams $l_1$, $l_2$ and $l_1$, deflected in the vertical direction by the galvano mirror 13, are traveled through projection lenses 14a, 14b and 14c to three light valves, that is, red, green and blue light valves 15R, 15G and 15B, respectively, thereby images corresponding to the laser beams $l_1$, $l_2$ and $l_3$ being drawn on the light valves 15R, 15G and 15B, respectively. In that event, even if the galvano mirror 13 and the respective light valves 15R, 15G and 15B are located with different distances therebetween, images having any angles of view can be focused on the respective light valves 15R, 15G and 15B by the respective projection lenses 14a, 14b and 14c because the entire optical system is formed as the afocal system as mentioned above.

Figure 5:
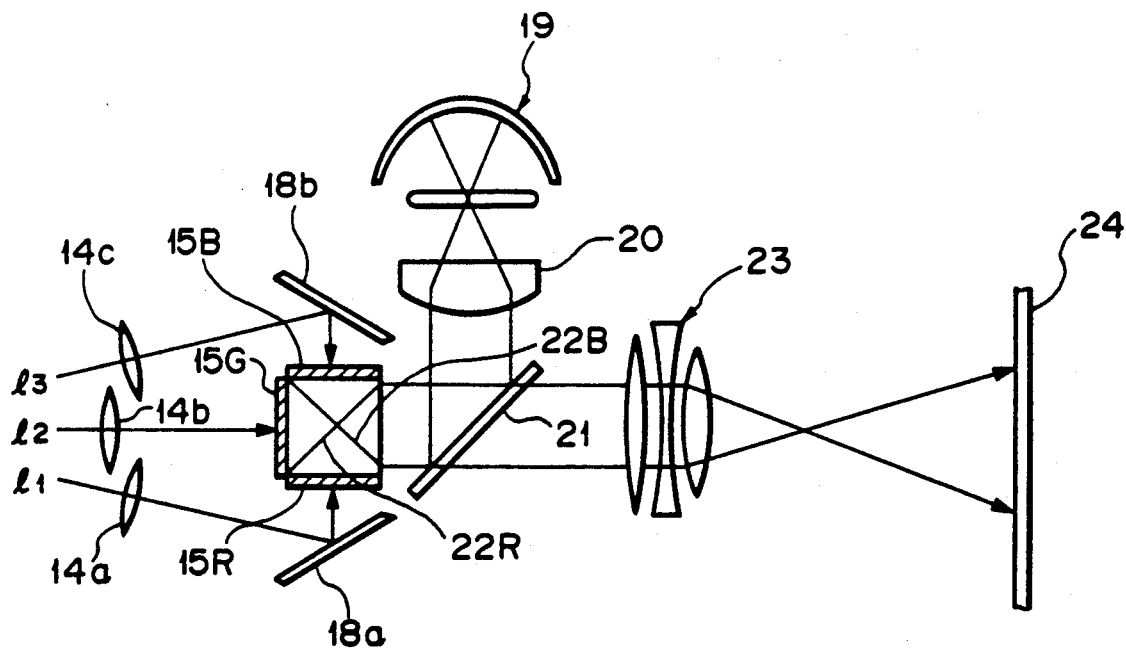
FIG. 5 is a schematic diagram showing a main portion of a projector according to the first embodiment of the invention.

When the laser scanning apparatus $A_1$ according to the first embodiment is used as an image input system in projectors such as a color television receiver or the like, as shown in FIG. 5, the laser beams $l_1$, $l_2$ and $l_3$ become incident on the red, green and blue light valves 15R, 15G and 15B, arranged in substantially C-letter configuration, through the projection lenses 14a, 14b and 14c, respectively. In the illustrated example, of the three laser beams $l_1$, $l_2$ and $l_3$, the laser beams $l_1$ and $l_3$ corresponding to red and blue colors are traveled through mirrors 18a and 18b to the red and blue light valves 15R and 15B, respectively. Then, a light from a white light source 19 is traveled through a condenser lens 20 to a polarizing beam splitter 21, in which a first polarized component of the light is reflected, and this reflected first polarized component is further reflected by a red reflecting dichroic mirror 22R so that only a red light becomes incident on the red light valve 15R. Also, of the first polarized component reflected by the polarizing beam splitter 21, only a green light directly becomes incident on the green light valve 15G, and of the first polarized component, only a blue light is reflected by a blue reflecting dichroic mirror 22B and becomes incident on the blue light valve 15B. Then, images drawn on the respective light valves 15R, 15G and 15B by the electro-optical effect due to the illumination of laser beams are projected through a projection lens 23 on a screen 24 together with the red, green and blue lights in an enlarged scale, thereby obtaining a color image.

As described above, according to this embodiment, since the three laser beams $l_1$, $l_2$ and $l_3$ of the same wavelength modulated by the three kinds of pattern information signal components are changed to the flatted laser beams by the lens system formed of the cylindrical lenses 1, 2, 4 to 6 and the ½ wavelength plate 3, and the alignment pitch of the respective laser beams $l_1$, $l_2$ and $l_3$ is reduced, the horizontal deflection means for three laser beams $l_1$, $l_2$ and $l_3$ can be realized by one acoustooptic deflector 7.

Further, since the three laser beams $l_1$, $l_2$ and $l_3$ of the same wavelength modulated by the red, green and blue video signal components are spatially separated by the mirrors 12a, 12b, 12c and the galvano mirror 13, the three laser beams $l_1$, $l_2$ and $l_3$ are processed by one horizontal deflection means (acoustooptic deflector 7) and one vertical deflection means (galvano mirror 13), whereby the images concerning red, green and blue colors can be simultaneously drawn on the red, green and blue light valves 15R, 15G and 15B, respectively. Also, the respective laser beams $l_1$, $l_2$ and $l_3$ of the same deflection characteristic can be obtained. Furthermore, since the cathode ray tube need not be provided, the laser scanning apparatus of this embodiment can be made compact in size, light in weight and small in power consumption. Further, since the laser beams are employed, the images of high coupling efficiency, i.e., very bright images having light utilizing ratio of substantially 100% and which have high resolution can be obtained on the red, green and blue light valves 15R, 15G and 15B and on the screen 24, respectively. Since the laser beams of single color are used, the inexpensive lens of simple arrangement and which can avoid aberration can be employed, which can presumably reduce the manufacturing cost of the laser scanning apparatus. Further, since interference between the laser beams is avoided, sharp images can be drawn on the light valves, respectively.

Particularly, in accordance with this embodiment, since the acoustooptic deflector 7 is employed as the horizontal deflection means for deflecting the laser beams $l_1$, $l_2$ and $l_3$, this acoustooptic deflector 7 reduces a height of the electrode thereof (the height of the ultrasonic wave generator 7b) and the power consumption by the high frequency generator which drives the ultrasonic wave generator 7b is small, the laser scanning apparatus of the present embodiment can be further reduced in size, in weight and in power consumption. Although the acoustooptic deflector 7 cannot solve a problem of wavelength dependency such that the deflection characteristic of the acoustooptic deflector 7 is changed depending on the wavelength of the incident light, the three laser beams have the same wavelength so that each laser beam can obtain the same deflection characteristic.

Figure 6:
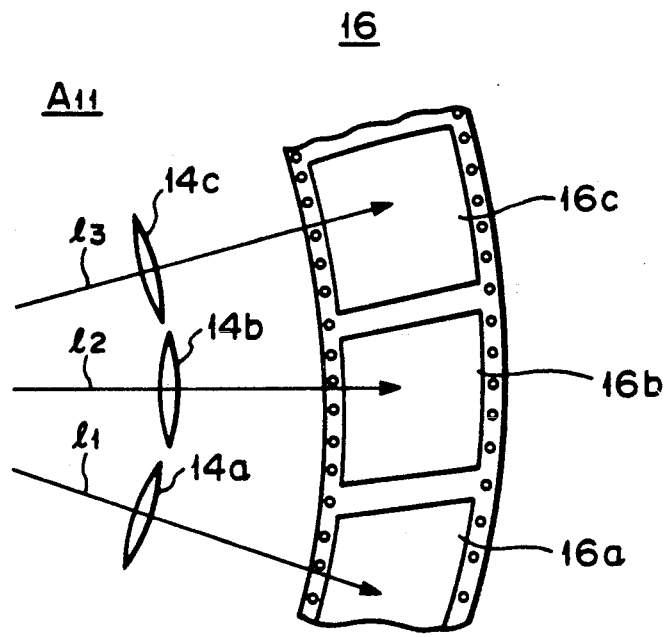
FIG. 6 is a schematic diagram showing a main portion of a first modified example of the first embodiment of the invention.

A modified example of the first embodiment will be described with reference to FIG. 6. The arrangement of this modified example is substantially the same as that of the first embodiment and is different only in that the medium on which images are drawn is a film 16. Accordingly, the arrangements from the laser diodes $LD_1$, $LD_2$ and $LD_3$ to the galvano mirror 13 are not shown and only the projection lenses 14a, 14b, 14c and films 16a, 16b and 16c are shown in FIG. 6.

In the laser scanning apparatus $A_{11}$ according to the modified example, three laser beams $l_1$, $l_2$ and $l_3$ of the same wavelength modulated by signal components of three kinds of pattern informations (in this case, film projection image informations) are made flat and reduced in alignment pitch by the lens system formed of the cylindrical lenses 1, 2 and 4 to 6 and the ½ wavelength plate 3, as shown in FIG. 4. These laser beams $l_1$, $l_2$ and $l_3$ are then horizontally deflected by the acoustooptic deflector 7, and converted in spot diameter and angle magnification by the lens system formed of the cylindrical lenses 8 to 11. Thereafter, these laser beams $l_1$, $l_2$ and $l_3$ are introduced through the mirrors 12a, 12b and 12c to the galvano mirror 13 and vertically deflected by the galvano mirror 13. Thereafter, as shown in FIG. 6, the horizontally and vertically deflected laser beams $l_1$, $l_2$ and $l_3$ are introduced through the projection lenses 14a, 14b and 14c to the three films 16a, 16b and 16c, and images corresponding to the laser beams $l_1$, $l_2$ and $l_3$ are simultaneously drawn on the films 16a, 16b and 16c, respectively. Incidentally, the wavelength of the three laser beams $l_1$, $l_2$ and $l_3$ is set so as to match with the sensitivity of the films 16a, 16b and 16c.

According to this modified example, similarly to the above-mentioned first embodiment, the three laser beams $l_1$, $l_2$ and $l_3$ having the same wavelength modulated by the film projection image information signal components of three kinds can be introduced onto the three films 16a, 16b and 16c, respectively and the images corresponding to the laser beams $l_1$, $l_2$ and $l_3$ can be respectively drawn on the films 16a, 16b and 16c, simultaneously. Accordingly, the laser scanning apparatus can be made compact in size, light in weight and small in power consumption.

Since the laser beams are employed as the means for drawing images on the film 16, an image of high coupling efficiency, that is, high light utilizing ratio and which is very bright and high in resolution can be obtained, and a relatively simple and inexpensive lens system can be utilized. Further, interference between the laser beams can be avoided and a sharp image can be obtained.

Figure 7:
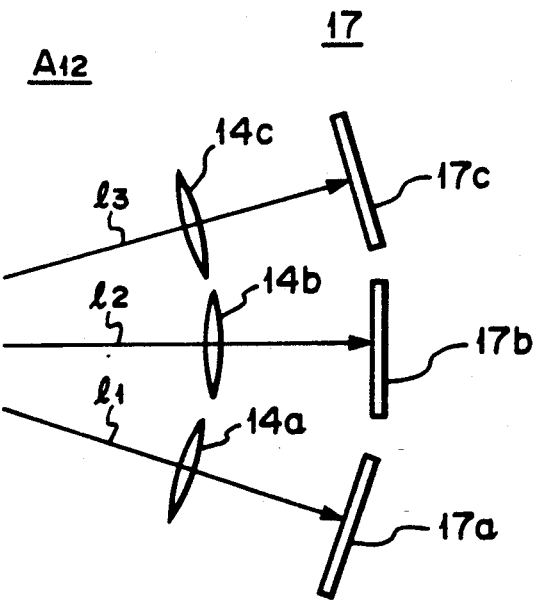
FIG. 7 is a schematic diagram showing a main portion of a second modified example of the first embodiment of the invention.

A second modified example of the first embodiment will be described with reference to FIG. 7. This second modified example arranged in substantially the same manner as that of the first embodiment and is different only in that a resist 17 for use in producing a printed circuit board, a semiconductor integrated circuit or the like is employed as the drawing medium. Accordingly, also in this modified example, the arrangement from the laser diodes $LD_1$, $LD_2$, $LD_3$ to the galvano mirror 13 will not be described and only the projection lenses 14a, 14b, 14c and the resist 17 will be described below.

In the laser scanning apparatus $A_{12}$ according to the second modified example, three laser beams $l_1$, $l_2$ and $l_3$ of the same wavelength modulated by mask pattern information signal components of three kinds are flatted and reduced in alignment pitch by the lens system formed of the cylindrical lenses 1, 2, 4 to 6 and the ½ wavelength plate 3. Thereafter, the respective laser beams $l_1$, $l_2$ and $l_3$ are horizontally deflected by the acoustooptic deflector 7 and then the spot diameter and angle magnification of each of the laser beams $l_1$, $l_2$ and $l_3$ is converted by the lens system formed of the cylindrical lenses 8 to 11 and then introduced through the mirrors 12a, 12b, 12c to the galvano mirror 13, thereby being deflected in the vertical direction by the galvano mirror 13. Then, as shown in FIG. 7, the horizontally and vertically deflected laser beams $l_1$, $l_2$ and $l_3$ are introduced through the projection lenses 14a, 14b and 14c to the three resists 17a, 17b and 17c, whereby images of mask patterns corresponding to these laser beams $l_1$, $l_2$ and $l_3$ are drawn on the resists 17a, 17b and 17c, respectively.

According to the second modified example of the first embodiment of the invention, the resist mask of high accuracy can be obtained. Also, similarly to the first embodiment, the laser scanning apparatus itself can be made compact in size, light in weight and small in power consumption.

A second embodiment of a laser scanning apparatus $A_2$ according to the present invention will hereinafter be described with reference to FIG. 8. In FIG. 8, like parts corresponding to those of FIG. 4 are marked with the same references and therefore need not be described in detail.

This laser scanning apparatus $A_2$ is different from that of the first embodiment in that the laser beams $l_1$, $l_2$ and $l_3$ are not parallelly but obliquely introduced into the acoustooptic deflector 7. In that event, an angle formed by the laser beams $l_1$, $l_2$ and $l_3$ is selected to be larger than the vibration angle of the galvano mirror 13 at the incident point of the galvano mirror 13. Accordingly, the three laser beams $l_1$, $l_2$ and $l_3$ are spatially separated by the galvano mirror 13 similarly to the first embodiment. Further, the light emitting end face of the acoustooptic deflector 7 is preferably formed as cut faces $7c_1$, $7c_2$ and $7c_3$ vertical to the emitted laser beams of the respective laser beams $l_1$, $l_2$ and $l_3$ so as to prevent cone line from being produced in the laser beams $l_1$, $l_2$ and $l_3$. The horizontally deflected laser beams $l_1$, $l_2$ and $l_3$ by the acoustooptic deflector 7 are corrected in cylindrical lens effect of the acoustooptic deflector 7 by the cylindrical lenses 6, respectively. Thereafter, the beam spot and the angle magnification of each of the laser beams $l_1$, $l_2$ and $l_3$ are converted by the cylindrical lenses 8, 11 and the cylindrical lenses 9 and 10, that is, the cross sections of the respective laser beams $l_1$, $l_2$ and $l_3$ are arranged as substantially circles and these laser beams $l_1$, $l_2$ and $l_3$ are deflected in the vertical direction by the galvano mirror 13 and then introduced to the mirror 25. The three laser beams $l_1$, $l_2$ and $l_3$ are reflected by the mirror 25, and then introduced through the three projection lenses 14a, 14b and 14c to, for example, the three light valves 15R, 15B and 15G, respectively, thereby images corresponding to the respective laser beams $l_1$, $l_2$ and $l_3$ being drawn on the light valves 15R, 15B and 15G, respectively.

According to the second embodiment of the present invention, since the cylindrical lenses 4 and 5 used in the first embodiment can be omitted and also the three mirrors 12a, 12b and 12c can be omitted, the laser scanning apparatus of this embodiment can be more simplified in arrangement as compared with the first embodiment.

While the light valves 15R, 15G and 15B are employed as the drawing media and the images corresponding to the three laser beams $l_1$, $l_2$ and $l_3$ are drawn on the respective three light valves 15R, 15G and 15B respectively in the second embodiment, as shown in the first modified example of the first embodiment, the films 16a, 16b and 16c may be used as the drawing media and image of different patterns may be drawn on these films 16a, 16b and 16c, respectively. Alternatively, as shown in the second modified example of the first embodiment, the resists 17a, 17b and 17c may be employed as the drawing media and mask patterns of different patterns may be drawn on the resists 17a, 17b and 17c, respectively.

While the present invention is applied to the three laser beams $l_1$, $l_2$ and $l_3$ in the above-mentioned first and second embodiments, the present invention can also be applied to one and two laser beams or the laser beams of more than three. Alternatively, in the first embodiment shown in FIGS. 4 and 5, the three laser beams $l_1$, $l_2$ and $l_3$ may be grouped as one set and three sets of laser beam groups, for example, may become incident, thereby images corresponding to these laser beam groups being displayed on the screen 24.

While in the first and second embodiments the galvano mirror 13 is used as the vertical deflection means, an acoustooptic deflector, a polygon mirror and so on may be employed as the vertical deflection means.

According to the laser scanning apparatus of the present invention, images of different pattern informations can be respectively drawn on a plurality of drawing media by one horizontal deflection means and one vertical deflection means. Thus, the laser scanning apparatus can be made compact in size, light in weight and small in power consumption. Furthermore, the pattern information can be drawn on the drawing medium at high coupling efficiency (high light utilizing ratio and satisfactory brightness) and at high resolution.

Having described preferred embodiments of the invention with reference to the accompanying drawings, it is to be understood that the invention is not limited to those precise embodiments and that various changes and modifications thereof could be effected by one skilled in the art without departing from the spirit or scope of the novel concepts of the invention as defined in the appended claims.

I claim as my invention:

1. A laser scanning apparatus comprising:
   (a) laser beam generating means for generating n parallel laser beams of the same wavelength modulated by pattern information signals of n kinds;
   (b) a first optical system for reducing an alignment pitch of said n laser beams generated from said laser beam generating means and deforming a cross-sectional shape of each of said n laser beams;
   (c) a single acoustooptic deflector for deflecting said n laser beams emitted from said first optical system in the horizontal direction;
   (d) a second optical system for enlarging the alignment pitch of said n laser beams emitted from said acoustooptic deflector and deforming a cross-sectional shape of each of said n laser beams;
   (e) reflecting means for reflecting said n laser beams emitted from said second optical system such that said n laser beams become incident on vertical deflection means at an angle larger than a vibration angle of said vertical deflection means; and
   (f) single vertical deflection means for deflecting said n laser beams in the vertical direction, wherein images are drawn on n different recording media by said n laser beams emitted from said vertical deflection means, respectively.

2. A laser scanning apparatus comprising:
   (1) laser beam generating means for generating n laser beams of the same wavelength modulated by pattern information signals of n kinds at a predetermined angle;
   (2) a single acoustooptic deflector for deflecting said n laser beams emitted from said laser beam generating means in the horizontal direction;
   (3) an optical system for introducing said n laser beams emitted from said acoustooptic deflector onto vertical deflection means at an angle larger than a vibration angle of said vertical deflection means and deforming a cross-sectional shape of each of said n laser beams; and
   (4) a vertical deflection means for deflecting said n laser beams emitted from said optical system in the vertical direction, wherein images are drawn on n different recording media by said n laser beams emitted from said vertical deflection means, respectively.

3. A laser scanning apparatus according to claim 1, wherein said first optical system is formed of a plurality of cylindrical lenses.

4. A laser scanning apparatus according to claim 1, wherein said first optical system is formed of a plurality of prisms.

5. A laser scanning apparatus according to claim 1, wherein an optical system for collimating said n laser beams into n collimated laser beams is provided between said laser beam generating means and said first optical system.

6. A laser scanning apparatus according to claim 1, wherein means for converting polarizing planes of said n laser beams is provided between said laser beam generating means and said first optical system.

7. A laser scanning apparatus according to claim 1, wherein an optical system for correcting a cylindrical lens effect of said acoustooptic deflector is provided ahead of or behind said acoustooptic deflector.

8. A laser scanning apparatus according to claim 1, wherein an optical system for enlarging an angle magnification of said n laser beams and deforming a cross-sectional shape of each of said n laser beams is provided between said acoustooptic deflector and said reflecting means.

9. A laser scanning apparatus according to claim 1, wherein an optical system for focusing each of said n laser beams on said recording media is provided between said vertical deflection means and said recording media.

10. A laser scanning apparatus according to claim 1, wherein said recording media are light valves and a color image is displayed on the basis of images drawn on said light valves.

11. A laser scanning apparatus according to claim 2, wherein an optical system for collimating each of said n laser beams into n collimated laser beam is provided between said laser beam generating means and said first optical system.

12. A laser scanning apparatus according to claim 2, wherein means for converting polarizing planes of said n laser beams is provided between said laser beam generating means and said first optical system.

13. A laser scanning apparatus according to claim 2, wherein an optical system for correcting a cylindrical lens effect of said acoustooptic deflector is provided ahead of or behind said acoustooptic deflector.

14. A laser scanning apparatus according to claim 2, wherein an optical system for enlarging an angle magnification of said n laser beams and deforming a cross-sectional shape of said n laser beams is provided between said acoustooptic deflector and said vertical reflecting means.

15. A laser scanning apparatus according to claim 2, wherein an optical system for focusing each of said n laser beams on said recording media is provided between said vertical deflection means and said vertical recording media.

16. A laser scanning apparatus according to claim 2, wherein said recording media are light valves and a color image is displayed on the basis of images drawn on said light valves.

* * * * *